(12) United States Patent
Caiger

(10) Patent No.: US 8,999,185 B2
(45) Date of Patent: Apr. 7, 2015

(54) ETCHING OR PLATING PROCESS AND RESIST INK

(75) Inventor: Nigel Anthony Caiger, Wookey Hole (GB)

(73) Assignee: Sun Chemical Corporation, Parsippany, NJ (US)

(*) Notice: Subject to any disclaimer, the term of this patent is extended or adjusted under 35 U.S.C. 154(b) by 905 days.

(21) Appl. No.: 12/375,506

(22) PCT Filed: Aug. 6, 2007

(86) PCT No.: PCT/US2007/075253
§ 371 (c)(1),
(2), (4) Date: Aug. 6, 2010

(87) PCT Pub. No.: WO2008/021780
PCT Pub. Date: Feb. 21, 2008

(65) Prior Publication Data
US 2011/0020970 A1    Jan. 27, 2011

(30) Foreign Application Priority Data
Aug. 7, 2006 (GB) .................................. 0615650.9

(51) Int. Cl.
| | | |
|---|---|---|
| B44C 1/22 | (2006.01) | |
| C09K 13/00 | (2006.01) | |
| H05K 3/00 | (2006.01) | |
| C09D 11/34 | (2014.01) | |
| H01L 31/18 | (2006.01) | |
| H05K 3/06 | (2006.01) | |
| H05K 3/10 | (2006.01) | |

(52) U.S. Cl.
CPC ............ *H05K 3/0076* (2013.01); *C09D 11/34* (2013.01); *H01L 31/18* (2013.01); *H05K 3/061* (2013.01); *H05K 3/108* (2013.01); *H05K 2203/013* (2013.01); *H05K 2203/0793* (2013.01)

(58) Field of Classification Search
USPC ................... 252/79.1, 79.4; 106/31.29, 31.13
See application file for complete search history.

(56) References Cited

U.S. PATENT DOCUMENTS

| | | | |
|---|---|---|---|
| 4,378,270 A | | 3/1983 | Brasch |
| 4,859,537 A | * | 8/1989 | Kawahito et al. ............ 428/32.6 |
| 4,963,189 A | * | 10/1990 | Hindagolla ................ 106/31.52 |
| 5,248,652 A | * | 9/1993 | Talvalkar ..................... 503/201 |
| 5,624,483 A | | 4/1997 | Fujioka |
| 5,779,779 A | * | 7/1998 | Jolly .......................... 106/31.29 |
| 6,022,678 A | * | 2/2000 | Makino ......................... 430/501 |
| 6,283,031 B1 | * | 9/2001 | Kakuta et al. ................. 101/466 |
| 6,336,720 B1 | * | 1/2002 | Suzuki et al. ................... 347/88 |
| 6,379,569 B1 | | 4/2002 | Rouberol |
| 6,652,635 B2 | * | 11/2003 | Rangaraj et al. ........... 106/31.29 |
| 2004/0106782 A1 | * | 6/2004 | Iwamoto et al. ............... 534/653 |
| 2005/0101483 A1 | * | 5/2005 | Washizuka .................... 503/201 |
| 2005/0165152 A1 | | 7/2005 | Barr et al. |
| 2006/0121389 A1 | | 6/2006 | Anzures et al. |
| 2006/0137573 A1 | * | 6/2006 | Brychcy et al. ............... 106/410 |
| 2010/0129754 A1 | | 5/2010 | Cheetham et al. |
| 2011/0287634 A1 | | 11/2011 | Barr et al. |

FOREIGN PATENT DOCUMENTS

| | | |
|---|---|---|
| DE | 3740149 A1 | 6/1989 |
| EP | 0676454 | 10/1999 |
| WO | WO 2004/106437 | 12/2004 |
| WO | WO 2005/045098 | 5/2005 |
| WO | WO 2006/087320 | 8/2006 |

OTHER PUBLICATIONS

International Search Report and Written Opinion of the International Searching Authority issued for International Application No. PCT/US2007/075253, Jan. 24, 2008.

* cited by examiner

*Primary Examiner* — Shamim Ahmed
(74) *Attorney, Agent, or Firm* — Charles C. Achkar; Ostrolenk Faber LLP

(57) ABSTRACT

The present invention provides a process of etching or plating comprising the steps of: i) ink jet printing an alkali removeable water insoluble hot melt ink jet ink onto a substrate to form a resist image; ii) etching or plating the substrate in an aqueous acid medium; and iv) removing the resist image with an aqueous alkali.

20 Claims, No Drawings

ETCHING OR PLATING PROCESS AND RESIST INK

CROSS REFERENCE TO RELATED APPLICATIONS

This application is the United States national phase filing of the corresponding international application number PCT/US2007/075253, filed on Aug. 6, 2007, which claims priority to and benefit of Great Britain application no. 0615650.9, filed Aug. 7, 2006, which applications are hereby incorporated by reference in their entirety.

TECHNICAL FIELD

The present invention relates to a process of etching or plating involving ink jet printing of a resist ink and to resist inks for use in the process.

BACKGROUND OF THE INVENTION

One well known way of etching a desired pattern or image onto a substrate involves first printing onto the substrate an ink, known as a resist ink, onto those parts of the substrate which are not to be etched to protect or mask those areas from the etching medium. The substrate carrying the resist ink mask is then exposed to the etching medium, for example, an aqueous acid, and the areas of the substrate which are not masked by the ink are etched. Following the etching step, the resist ink is removed from the substrate, for example, by washing in alkali. This process is widely used in the fabrication of printed circuit boards, where multiple deposition, masking, and etching steps are used to build up complex structures. Resist inks are also used in etching during fabrication of solar cells and steel embossing belts.

As well as etching, resist inks find application in electroplating. In that situation, the resist ink masks areas of the substrate from the electroplating medium and thereby prevents deposition on those areas. This process is used in the manufacture of some solar cells.

Screen printing is widely used to apply resist inks to the substrate. That technique is low cost and reliable.

The inks used in screen printing of resists are often photocurable, so that the ink can be cured to a hard film immediately after it has been printed onto the substrate. Such screens inks typically comprise up to 40% of an alkali soluble resin to impart alkali solubility to the cured ink layer so that they can be washed off the substrate with aqueous alkali.

Recently, attempts have been made to print resist images using ink jet printing. Ink jet printing has some advantages over screen printing, for example, images stored in computer readable form can be printed directly to the substrate and a higher resolution may be achieved. However, the adoption of ink jet as a method of printing resists has been limited, in part, because the currently available ink jet inks do not have the combination of properties including easy removeability desired in a resist ink.

In particular, because ink jet inks must have a very low viscosity in order to be jetted properly, the inks tend to spread rapidly on the surface of the substrate before they are cured, especially where the substrate has a non-flat or structured surface, thereby losing edge definition. Additionally, conventional ink jet inks are difficult to remove from the substrate, requiring the use of organic solvents and/or mechanical scraping or abrasion.

There remains a need for improved resist inks and for improved methods of etching and plating involving resist inks.

SUMMARY OF THE INVENTION

The present invention provides a process of etching or plating comprising the steps of:
 i) ink jet printing an alkali removeable water insoluble hot melt ink jet ink onto a substrate to form a resist image;
 ii) etching or plating the substrate in an aqueous acid medium; and
 iii) removing the resist image with an aqueous alkali.

In a further aspect, the invention provides an alkali removeable acid water insoluble hot melt ink jet ink for use as an etch or deposition (eg plating) resist.

DETAILED DESCRIPTION OF THE INVENTION

Aqueous alkali washing is currently widely used to remove screen resist inks and so the resist removing stage of the process of the invention can generally be carried out by the operators of the process using conventional washing equipment. The use of aqueous alkali as the washing medium for removal of the resist ink moreover avoids the need for use of organic solvents, which are undesirable for reasons of safety, impact on the environment, and cost. In the process of the invention the ink is alkali removeable and it will in general also be unnecessary to use mechanical means to remove the resist ink, for example, by rubbing or scraping.

The ink is a hot melt ink, that is, it is a solid at ambient temperature, say, 25° C. and is melted in the printer and jetted hot onto the substrate. The inventors have found that hot melt ink jet inks give particularly good resist image definition because they cool and solidify very rapidly following contact with the substrate, thereby inhibiting spreading of the ink. Conventional hot melt inks are based largely on hydrocarbon waxes and are therefore completely insoluble in aqueous media. Such conventional hot melt inks can be removed only by washing with organic solvents or by mechanical scraping and have not found application as resists. The inventors have found that it is possible to formulate hot melt inks which are suitable for application by ink jet and which can be easily removed by washing with aqueous alkali, whilst being insoluble in acidic media used for etching and plating.

The term "alkali removeable" as used herein means that the ink may be removed easily from the substrate using the aqueous alkali conditions commonly employed during etching and plating processes.

The term "water insoluble" as used herein means that the ink is insoluble both in neutral water (pH 7.0-6.5) and also in the aqueous acid media commonly used for etching and plating processes and will therefore not be removed from the substrate during the etching or plating step, or in any associated water rinsing step.

The terms "water washability" and "alkali washability" and the like as used herein refer to water and alkali washability as determined by the test methods given below.

Optionally, the ink has an alkali washability of at least 80%, preferably at least 90%, more preferably at least 95%, and especially preferably at least 99%.

Optionally, the ink has a water washability of less than 20%, preferably less than 10%, more preferably less than 5%, and especially preferably less than 1%.

The ink may be applied to the substrate using any ink jet printer suitable for printing hot melt inks. Print heads suitable for printing hot melt inks are available from Spectra.

The etching or plating process may be any such process which involves contacting the substrate with neutral water or an aqueous acid.

The process may involve etching the substrate with aqueous acid. The etching may involve a "PAWN" solution (that is, a solution comprising phosphoric acid, acetic acid, water and nitric acid). PAWN solution is suitable to etch copper and aluminium. The process may involve etching the substrate with a solution comprising hydrogen peroxide and, optionally, also sulphuric acid. Such solutions are suitable for etching, for example, titanium-tungsten layers in solar cell manufacture. The process may involve etching silica with a solution comprising hydrogen fluoride and/or a fluoride salt. The process may be a process of electroplating a metal such as copper or tin onto the substrate. The substrate may be a substrate for a printed circuit board. The process may be a process of etching or plating in the manufacture of a solar cell. The process may be a process of etching a steel embossing belt, for example, a belt of the type used to imprint wood grain pattern onto woody materials.

The ink will typically comprise components which are soluble or dispersible in aqueous alkali, for example, in a 5% aqueous potassium hydroxide solution. That helps to avoid the ink being removed in the form of flakes or strips which may block filter equipment and drains. Preferably, the ink consists essentially of components which are alkali soluble or which disperse in aqueous alkali to particles which are smaller than 10 microns ($\mu$m) in diameter. For example, many pigments will not be soluble in aqueous alkali but will disperse when the ink is washed off the substrate into particles which are less than 10 $\mu$m in diameter (that is, they pass through a 10 micron sieve). Preferably, the ink comprises at least 95%, more preferably at least 98%, and especially preferably at least 99% by weight of components which are soluble in aqueous alkali. Preferably, the ink comprises at least 95%, more preferably at least 98%, and especially preferably at least 99% by weight of components which each have an alkali washability of at least 80%, preferably at least 90%, more preferably at least 95%, and especially preferably at least 99%.

The ink may contain an alkali soluble wax. The alkali soluble wax may be an organic acid such as a carboxylic acid. Suitable alkali soluble waxes are myristic acid, stearic acid, palmitic acid, lauric acid and other acid functional waxes such as the Unicid range from Baker Petrolitc. Myristic acid is preferred. The wax preferably has an alkali washability of at least 80%, more preferably at least 90%, especially preferably at least 95%, and most preferably at least 99%. The ink optionally comprises at least 30%, preferably at least 50% by weight of one or more alkali soluble waxes. Optionally, the ink comprises no more than 99%, preferably no more than 90% by weight of the alkali soluble wax or waxes.

Preferably, the ink comprises one or more alkali soluble waxes having melting points in the range of from 40 to 80° C. If the aqueous alkali used in the washing stage is heated to a temperature equal to or above the melting point of the wax the wax will melt during the washing and the ink will wash away more quickly. Of course, if the etching or plating step is one involving an elevated temperature, the components of the ink should be selected such that the ink does not melt or soften at that elevated temperature.

Preferably, the ink comprises an alkali soluble resin. In general, resins increase adhesion to the substrate. Preferably, the resin has an alkali washability of at least 80%, more preferably at least 90%, especially preferably at least 95%, and most preferably at least 99%. Suitable alkali soluble resins include acid functional rosins, modified rosins and modified rosin esters with residual acid value and also such products as Ennesin M57w, Ennesin PM45/HMP, Ennesin FM65 ex Lawter, Prince 2000, Prince 6500 ex Hexion and other products from Hercules, Pinova etc. Rosin ester resins with acid values are preferred alkali soluble resins. Whilst they increase adhesion to the substrate, which is desirable, resins will also tend to increase the melt viscosity of the ink thereby making it more difficult to jet. Optionally, the ink comprises up to 40% by weight, preferably up to 20% by weight of the alkali soluble resin or of a mixture of alkali soluble resins. Preferably, the ink comprises at least 2%, more preferably at least 5% by weight of an alkali soluble resin or of a mixture of such resins.

Whilst the inclusion of a colorant in the ink is not necessary the ink preferably does comprise a colorant such as a pigment or a dye or a fluorescing agent so that the resist image is easily detectable. Advantageously, the process of the invention includes a step of detection and assessment of the resist image. Such a step allows rejection of resist images which have significant imperfections, thereby enhancing the overall process technology. Preferably, the detection and assessment is automated. The colorant may be a dye, for example, any dye soluble in the ink eg the Orasol solvent soluble dyes ex Ciba or suitable fat/oil soluble dyes eg Oilsol ex BASF. Inks comprising fluorescent agents are particularly suitable for automated detection and assessment.

The ink may include further conventional ink additions such as stabilizers and wetting agents. Preferably, the ink comprises at least one stabilizer, colorant, antioxidant or wetting agent.

In some applications, especially those in which the substrate is easily damaged, it is also preferable that the ink is free of particulate materials such as silicon dioxide. Preferably, the ink comprises less than 1% by weight, more preferably less than 0.01% by weight of silicon dioxide.

In order that it be jetted efficiently, the ink preferably has a low melt viscosity. Preferably, the ink has a viscosity of no more than 20 mPas, more preferably no more than 12 mPas, at a temperature in the range of from 50 to 125° C. Advantageously, the ink is suitable for printing through a Spectra Nova 256 or S-class print head.

The washing step may involve contacting the etched or plated substrate with aqueous alkali by immersion or spraying. Preferably, the ink and the washing conditions are such that the ink dissolves completely rather than leaving a particulate residue or flakes which might clog machine pipes, filter screens or drains.

Test Method for assessing Alkali Washability of Inks and Ink Components

1) Take a piece of copper sheet (approximately 25 mm×75 mm×1 mm thick) and weigh to 4 decimal places to give Wt(base)
2) Coat half the copper with the ink to be tested with a layer of ink approximately 15-30 microns thick. This can be achieved using a 24 micron draw down bar (Meyer rod). The precise thickness of the coating in the above range is not critical.
3) Weigh the coated copper to give Wt(base+ink)
4) Dip the coated copper into a beaker containing 5% KOH in water, at a temperature of 50° C. Agitate the slide in the solution for 5 minutes by side to side motion of the copper in the KOH solution.
5) Remove the copper from the KOH solution and rinse under running water. Collect the rinse water in a beaker.
6) Dry the copper in an oven at 40° C. for 30 minutes
7) Weight the copper to give Wt(base+residue)

8) Calculate the alkali washability as follows:

Alkali Washability=(Wt(base+ink)−Wt(base+residue))/(Wt(base+ink)−Wt(base))×100

Preferably, the ink or ink component is such that the KOH solution and rinse solution are free of large (<1 mm) pieces of ink in the form of lumps, flakes, and shards etc.

Test Method for Assessing Water Washability of Inks and Ink Components

1) Take a piece of copper sheet (approximately 25 mm×75 mm×1 mm thick) and weigh to 4 decimal places to give Wt(base)
2) Coat half the copper with the ink to be tested with a layer of ink approximately 15-30 microns thick. This can be achieved using a 24 micron draw down bar (Meyer rod). The precise thickness of the coating in the above range is not critical.
3) Weigh the coated copper to give Wt(base+ink)
4) Dip the coated copper into a beaker containing in water, at a temperature of 50° C. Agitate the slide in the solution for 5 minutes by side to side motion of the copper in the water.
5) Remove the copper from the water and rinse under running water. Collect the rinse water in a beaker.
6) Dry the copper in an oven at 40° C. for 30 minutes
7) Weight the copper to give Wt(base+residue)
8) Calculate the water washability as follows:

Water washability=(Wt(base+ink)−Wt(base+residue))/(Wt(base+ink)−Wt(base))×100

EXAMPLES

Specific embodiments of the invention will now be described for the purpose of illustration only.

Inks were prepared having the compositions shown in the table. The inks were then tested for alkali and water washability, and the results are also given in the table.

|  | Example 1 | Example 2 | Example 3 | Example 4 | Comparative Example 1 | Comparative Example 2 |
|---|---|---|---|---|---|---|
| Unilin 425 (2) |  |  |  |  | 79.5 |  |
| PEG 1000 |  |  |  |  |  | 98.5 |
| Myristic Acid | 98.5 | 88.5 | 60 |  |  |  |
| Stearic Acid |  |  | 28.5 | 88.5 |  |  |
| Rosin Ester Resin (1) |  | 10 | 10 | 10 | 19 |  |
| Dye-Orasol Black RLI (3) | 1 | 1 | 1 | 1 | 1 | 1 |
| Tween 80 Wetting agent | 0.5 | 0.5 | 0.5 | 0.5 | 0.5 | 0.5 |
| Viscosity cps @ Temperature | 8.1 60° C. | 12.6 60° C. | 12.6 70° C. | 12.4 75° C. | 10.3 125° C. | 11.9 115° C. |
| Alkali Washability % | 100 | 100 | 100 | 98 | 0 | 100 |
| Water Washability % | 0 | 0 | 0 | 0 | 0 | 100 |

Notes:
(1) = Ennesin M57W ex Lawter
(2) ex Baker Petrolite
(3) ex Ciba

As can be seen, Example inks 1 to 4 each have a melt viscosity suitable for ink jet printing. They are all highly alkali washable but are not water washable.

Comparative Example 1 is a typical conventional hot melt ink jet ink formulation. As can be seen from the table, it is not alkali removable. It would therefore not be removable from a substrate by washing with aqueous alkali.

Comparative Example 2 is a water soluble hot melt ink jet ink. As can be seen from the table, it is removable by aqueous alkali and also by water. It would therefore be removed during an etching or plating step, or in a water rinse associated with that step.

The invention claimed is:

1. A process of etching or plating comprising the steps of:
   i) ink jet printing an alkali removable water insoluble hot melt ink jet ink onto a substrate to form a resist image;
   ii) etching or plating the substrate in an aqueous acid medium; and
   iii) removing the resist image with an aqueous alkali
      wherein the ink comprises an alkali soluble resin and at least 30% by weight of an alkali soluble wax which includes an organic acid and
      wherein the ink comprises 95% by weight or more of alkali soluble components.

2. A process as claimed in claim 1 in which in the removing step the resist ink disperses in the aqueous alkali to form a solution in which less than 5% by weight of the resist ink is in the form of particles which would be retained by a 10 micron filter.

3. A process as claimed in claim 1 which is a method of etching and step ii) involves etching the substrate with an aqueous acid medium.

4. A process as claimed in claim 3 in which a metal is etched using an etching solution including phosphoric acid, acetic acid, water and nitric acid.

5. A process as claimed in claim 3 in which a metal is etched using a solution comprising sulphuric acid and hydrogen peroxide.

6. A process as claimed in claim 3 in which silica is etched using a solution comprising hydrofluoric acid.

7. A process as claimed in claim 1 which is a process of electroplating copper or tin onto the substrate.

8. A process as claimed in claim 1 which is a process of etching or plating in the manufacture of a circuit board.

9. A process as claimed in claim 1 which is a process of etching or plating in the manufacture of a solar cell.

10. A process as claimed in claim 1 which is a process of etching a steel embossing belt.

11. An alkali removable water insoluble hot melt ink jet ink for use as an etch or deposition resist, wherein the ink comprises an alkali soluble wax and an alkali soluble resin, wherein the ink comprises at least 30% by weight of the alkali soluble wax, wherein the alkali soluble wax includes an organic acid and wherein the ink comprises 95% by weight or more of alkali soluble components.

12. An ink as claimed in claim 11 which comprises from 50 to 95% by weight of the alkali soluble wax.

13. An ink as claimed in claim 11 in which the alkali soluble wax has a melting point in the range of from 45 to 60° C.

14. An ink as claimed in claim 11 which comprises a colorant.

15. An ink as claimed in claim 11 which comprises a fluorescent agent.

16. An ink as claimed in claim 11 which is substantially free of particulates.

17. An ink as claimed in claim 11 which has melt viscosity of 100 mPas or less at 125° C.

18. An ink jet printer including an ink as claimed in claim 11.

19. A substrate for an etching or plating process having on at least one surface a resist image of an ink as claimed in claim 11.

20. An ink as claimed in claim 11 which has an alkali washability of at least 80% and a water washability of less than 20%.

* * * * *